United States Patent
Chassoulier et al.

(10) Patent No.: US 10,876,860 B2
(45) Date of Patent: Dec. 29, 2020

(54) POSITION SENSOR

(71) Applicant: THALES, Courbevoie (FR)

(72) Inventors: Damien Chassoulier, Mouans-Sartoux (FR); Alain Blanc, Auribeau sur Siagne (FR); Guy Carron de la Morinais, Cannes (FR)

(73) Assignee: THALES, Courbevoie (FR)

( * ) Notice: Subject to any disclaimer, the term of this patent is extended or adjusted under 35 U.S.C. 154(b) by 71 days.

(21) Appl. No.: 15/787,581

(22) Filed: Oct. 18, 2017

(65) Prior Publication Data
US 2018/0106643 A1   Apr. 19, 2018

(30) Foreign Application Priority Data
Oct. 19, 2016 (FR) ........................... 16 01516

(51) Int. Cl.
*G01D 5/14* (2006.01)
*G01R 33/383* (2006.01)

(52) U.S. Cl.
CPC ........... *G01D 5/145* (2013.01); *G01R 33/383* (2013.01)

(58) Field of Classification Search
CPC ...... G01D 5/145; G01D 5/2458; G01D 5/244; G01R 33/383; G01B 7/30; G01L 3/104
USPC ...... 324/200, 207.11–207.25, 245–247, 500, 324/529, 530
See application file for complete search history.

(56) References Cited

U.S. PATENT DOCUMENTS

| | | | | |
|---|---|---|---|---|
| 2005/0127902 A1* | 6/2005 | Sogge | ............. | G01D 3/08 324/207.2 |
| 2010/0308805 A1* | 12/2010 | Stuve | ............. | G01D 5/145 324/207.24 |
| 2011/0215797 A1* | 9/2011 | Steinich | ............. | G01D 5/244 324/207.25 |
| 2011/0316528 A1* | 12/2011 | Matsumoto | ............. | G01D 5/142 324/207.14 |
| 2016/0069709 A1* | 3/2016 | Kernebeck | ............. | G01D 5/145 324/207.22 |
| 2017/0276513 A1 | 9/2017 | Lee | | |

FOREIGN PATENT DOCUMENTS

| | | |
|---|---|---|
| EP | 0 558 364 A1 | 9/1993 |
| EP | 1 790 950 A1 | 5/2007 |

OTHER PUBLICATIONS

S. Tahara et al., "Thrust characteristics of 2-pole PMLSM composed of flux concentrated arrangement with Halbach array," IEEE International Conference on Electrical Machines and Systems, Nov. 15, 2009, pp. 1-4, XP031612181.

* cited by examiner

*Primary Examiner* — Melissa J Koval
*Assistant Examiner* — Trung Nguyen
(74) *Attorney, Agent, or Firm* — BakerHostetler

(57) ABSTRACT

A position sensor to provide an absolute position of a movable portion with respect to a fixed portion of a mechanism comprises two elements to move with respect to one another. The first element comprises a component that is sensitive to a magnetic field. The second element comprises two pairs of magnets. In each of the pairs, the orientation of each of the magnets alternates. An air gap is formed between the two pairs of magnets, the air gap configured to allow the component to pass therethrough. Each magnet of one pair faces a magnet of the other pair and the magnets facing one another have the same orientation.

12 Claims, 2 Drawing Sheets

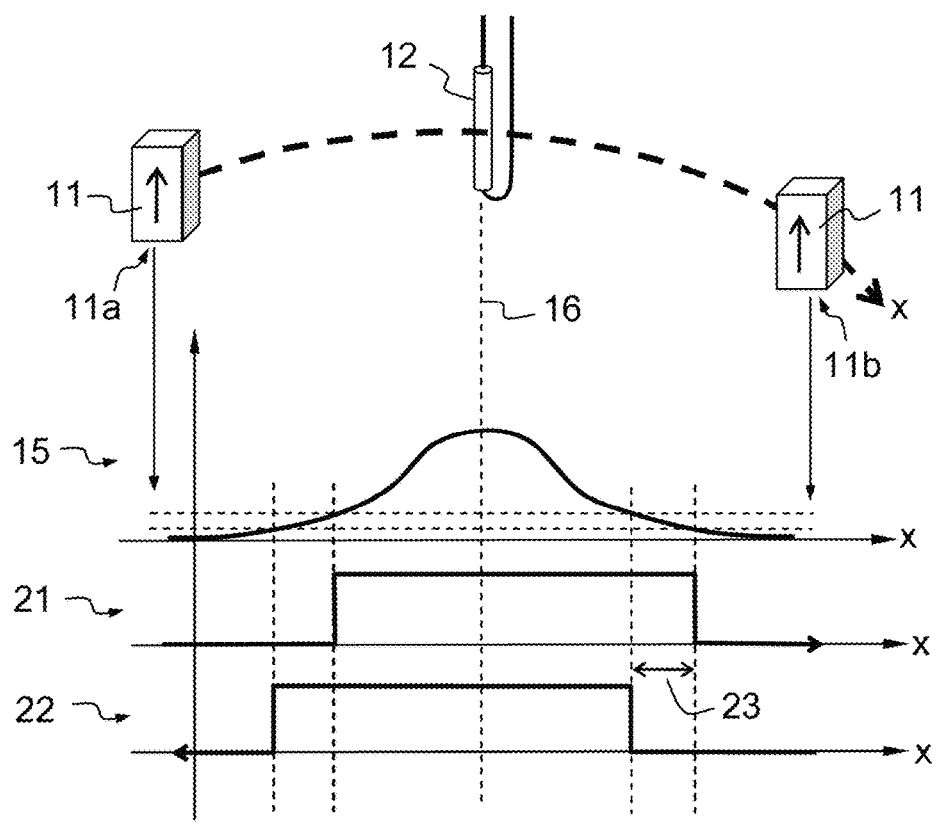
FIG.1a
FIG.1b
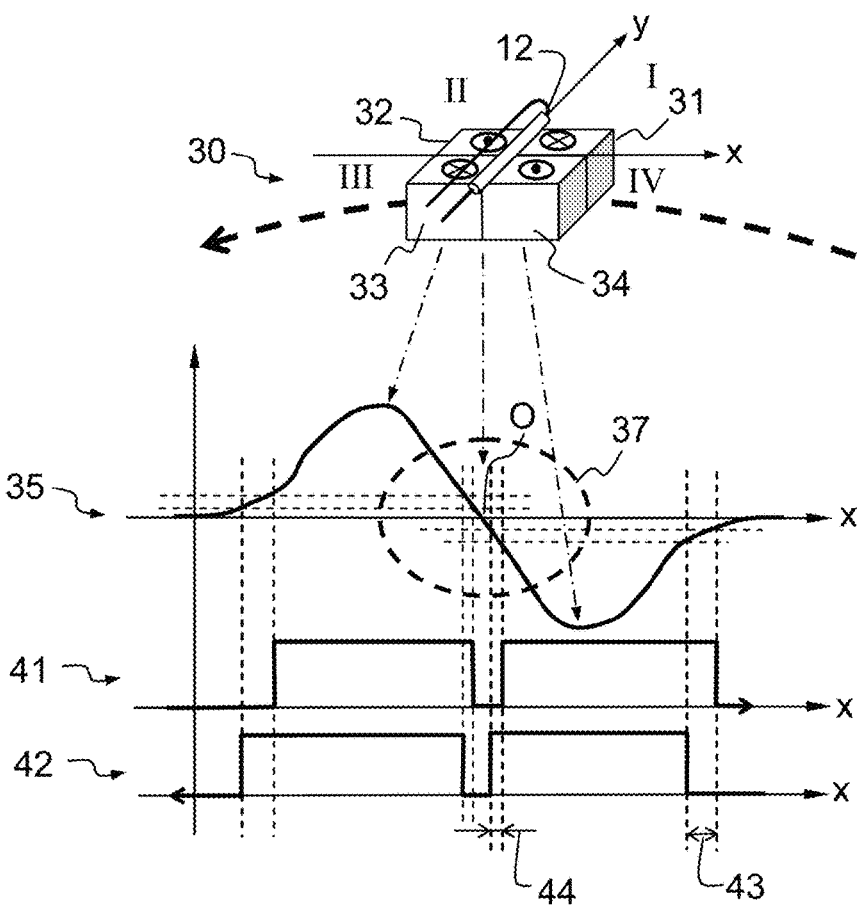
FIG.2a
FIG.2b

POSITION SENSOR

CROSS-REFERENCE TO RELATED APPLICATION

This application claims priority to foreign French patent application No. FR 1601516, filed on Oct. 19, 2016, the disclosure of which is incorporated by reference in its entirety.

FIELD OF THE INVENTION

The invention relates to a position sensor making it possible to provide an absolute position of a movable portion with respect to a fixed portion of a mechanism.

BACKGROUND OF THE INVENTION

One particular use of the invention is in deployable mechanisms in order to determine the position of the movable portion with respect to the fixed portion. This type of sensor may in particular be used in a satellite in which certain appendages such as solar panels or antenna elements are deployed in space. Another use of the invention is in electric machines, e.g. motors or generators, in which it is useful to have knowledge of the position of the rotor with respect to the stator, for example in order to acquire, on each rotation, an absolute reference position. More generally, the invention may be implemented in any mechanism having a movable portion for which it is desirable to have knowledge of the absolute position at a point on its travel.

In order to measure a position without contact between the two portions of the mechanism, it is possible to use a Hall effect sensor positioned on one of the portions. The sensor detects the transit of a magnetic component positioned on the other portion of the mechanism. In an electric motor, it is for example possible to have knowledge of the position of a pole of the rotor by means of a Hall effect sensor placed on the stator.

There are other magnetic sensors in the form of a switch sensitive to magnetic fields. These switches are known in the literature as reed switches. They comprise magnetized metal reeds that come into contact with one another when they are subjected to a sufficient magnetic field. These sensors make it possible to detect a permanent magnet when it approaches the sensor.

In general, reed magnetic sensors are not very accurate. Specifically, numerous parameters such as temperature may cause the intensity of the magnetic field in the vicinity of the sensor to vary. Detection is then subject to the vagaries of the environment. In a permanent magnet, a variation in temperature directly affects the intensity of the magnetic field generated by the magnet. Moreover, in a complex mechanism, a variation in temperature often entails variations in size of the mechanical parts of the mechanism, which are liable to change a distance separating the sensor from the magnet and hence the intensity of the magnetic field detected by the sensor.

Other types of sensors may also be used in order to determine, without contact, a position of a movable part with respect to a fixed part, for example an optical sensor. A light emitter is positioned on one of the portions and a reflector on the other portion. An optical sensor is positioned in proximity to the emitter. The sensor can then detect radiation arising from the emitter and reflected by the reflector.

Optical sensors are generally more accurate than magnetic sensors. However, they are generally much more expensive.

SUMMARY OF THE INVENTION

The invention aims to overcome all or some of the problems mentioned above by proposing an inexpensive, novel, accurate position sensor based on magnetic detection.

To this end, the subject of the invention is a position sensor comprising two elements that are intended to move with respect to one another, a first of the two elements comprising a component that is sensitive to a magnetic field, a second of the two elements comprising two pairs of magnets, in each of the pairs, the orientation of each of the magnets alternating, an air gap being formed between the two pairs of magnets, the air gap being configured to allow the component to pass therethrough, each magnet of one pair facing a magnet of the other pair and the magnets facing one another having the same orientation.

The sensor according to the invention is capable of providing an absolute reference position. It is inexpensive, accurate, insensitive to temperature and insensitive to the thermoelastic expansion of the mechanism in which it is mounted.

In one particular embodiment, the poles of each of the magnets are positioned on axes that are parallel to one another, the two elements are intended to move with respect to one another along an axis that is perpendicular to the axes of the poles of the magnets. In this direction of movement, referred to as the favoured direction, the magnetic field varies linearly, in particular when the sensitive element moves past a junction between the magnets of each pair. Perpendicularly to this direction of movement, the magnetic field varies little. Consequently, the sensor is very tolerant of movements that are perpendicular to the favoured direction. During these perpendicular movements, the sensitive element will be subject to almost no variation in detection.

The component may have an axis that is sensitive to the magnetic field and the sensor is configured so that the sensitive axis of the component is perpendicular to the axis of movement of the two elements.

For the two pairs of magnets, the magnets of one and the same pair may make contact with one another or are at a distance from one another.

In order to concentrate the magnetic flux inside the air gap, the sensor may comprise additional magnets that are positioned at the pole end of each of the magnets of the two pairs in a Halbach configuration.

The component may be a switch that is sensitive to the magnetic field or may make use of the Hall effect in order to detect a variation in magnetic field.

BRIEF DESCRIPTION OF THE FIGURES

The invention will be better understood and further advantages will become apparent upon reading the detailed description of one embodiment given by way of example, which description is illustrated by the attached drawing in which:

FIG. 1a schematically shows the principle of measuring a component sensitive to a magnetic field with respect to a single permanent magnet;

FIG. 1b shows, for a measurement made in the context of FIG. 1a, the information arising from the component according to the movement of the magnet;

FIG. 2a schematically shows another configuration with a plurality of adjoined magnets;

FIG. 2b shows, for a measurement made in the context of FIG. 2a, the information arising from the component according to the movement of the magnets;

For the sake of clarity, the same elements will bear the same references in the various figures.

DETAILED DESCRIPTION OF SEVERAL EMBODIMENTS OF THE INVENTION

Figure 3:
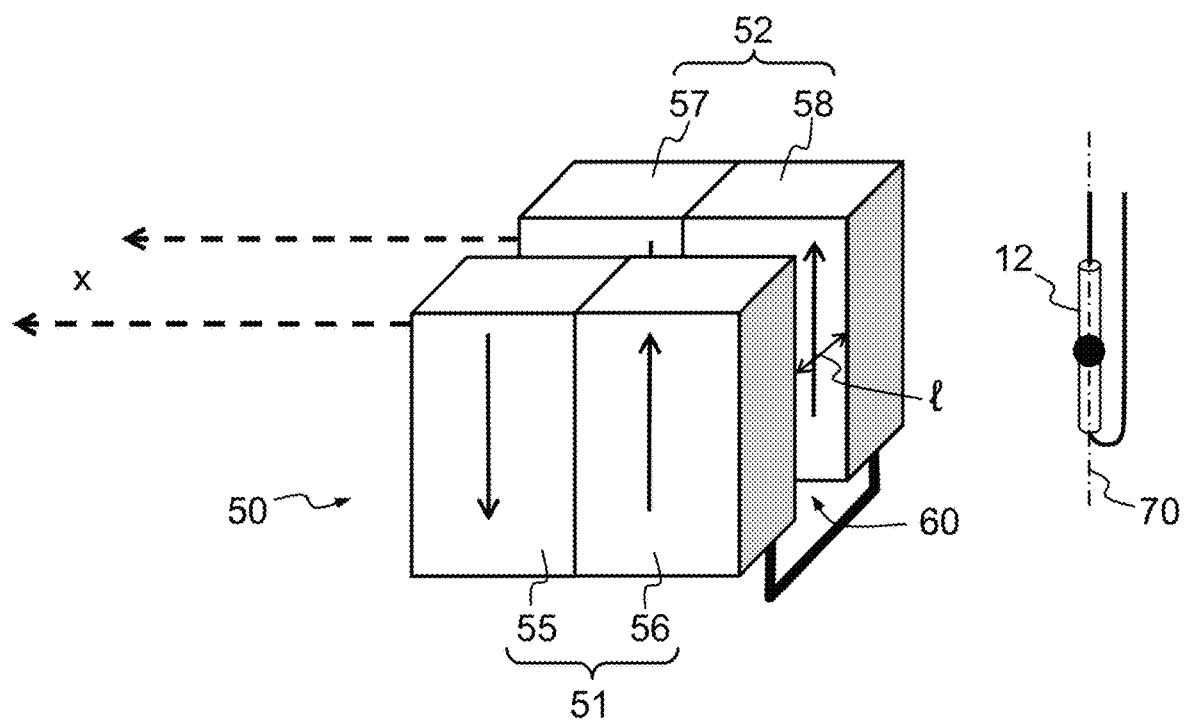
FIG. 3 schematically shows a preferred configuration of a sensor according to the invention.

The invention relates to a sensor intended to determine the relative position of two physical objects of a system, the two objects moving with respect to one another along a predefined trajectory that may vary within a tolerance range. Variation in the trajectory may be ascribed to various causes, in particular the manufacturing tolerances of various mechanical parts forming the two physical objects and of the linkage linking the two physical objects. Moreover, during the operation of the system, the trajectory may vary according to the environmental conditions, and in particular according to the temperature to which each mechanical part of the system is subjected. The distance may in particular vary according to the ambient temperature and also according to heating due to the operation of the system. In an electrical system, this may be for example losses due to Joule heating of a motor located in proximity which may heat certain mechanical parts.

The sensor according to the invention is formed from two elements that are each intended to be attached to one of the two physical objects for which it is desired to determine the relative position. Hereinafter, it will be possible to define a fixed object and a movable object or else a fixed element and a movable element of the sensor. The concept of fixed and movable should simply be understood relatively according to a coordinate system attached to one of the two objects.

FIG. 1a schematically shows a permanent magnet 11 moving with respect to a component 12 that is sensitive to a magnetic field. The permanent magnet 11 follows a trajectory varying between two extreme positions 11a and 11b. An arrow is shown on the permanent magnet 11. This arrow represents the orientation of the poles of the magnet 11. Conventionally, the tail of the arrow represents the south pole and the head of the arrow represents the north pole. The component 12 is for example a switch that is sensitive to magnetic fields, known in the literature as a reed relay. More specifically, the switch of the relay is open if the magnetic field is zero. Beyond a magnetic field threshold, the switch is closed. It is of course possible to select a component that operates inversely: the switch is closed when the component 12 is not subjected to any magnetic field and open beyond the threshold. This type of component has the advantage of low production cost. Alternatively, it is of course possible to make use of other types of components that are sensitive to a magnetic field, such as for example a Hall effect sensor.

FIG. 1b shows three curves that are functions of the trajectory of the magnet 11, which trajectory is shown on the abscissa. A first curve 15 represents the intensity of the magnetic field received by the component 12 along the trajectory of the magnet 11. In the positions 11a and 11b of the magnet, the magnetic field received by the component 12 is substantially zero. The curve 15 is substantially shaped like a bell curve, the maximum of which is obtained when the magnet 11 is closest to the component 12. The curve 15 is symmetrical with respect to a vertical axis 16 passing through the maximum of the curve 15.

The component 12, in the form of a switch, may deliver a binary signal that is representative of its open or closed state. Two curves 21 and 22 represent, in binary form, the state of the component 12. A high level of the signal conventionally represents a closed state and a low level an open state. The component 12 is for example closed when it is subjected to a magnetic field having an intensity that is higher than a threshold. It is also possible to make use of a component 12 operating inversely, i.e. a component formed from a switch that opens when it is subjected to a magnetic field having an intensity that is higher than a threshold.

The curve 21 represents the binary state of the component 12 when the magnet 11 moves from the position 11a to the position 11b and the curve 22 represents a binary state of the component 12 when the magnet 11 moves from the position 11b to the position 11a. It has been observed that, for this type of component 12, the opening threshold and the closing threshold are not strictly identical, hence the offset, denoted by 23, of the two curves which are not perfectly superposed, hence the difficulty in determining an exact reference position of the component 12 with respect to the magnet 11. Added to this offset are potential fluctuations in the curve 15 due in particular to variations in the temperature of the system which are liable to modify the relationship between a change of state of the component 12 and the position of the magnet 11 with respect to the component 12.

FIG. 2a shows another configuration in which a set 30 of four magnets 31, 32, 33 and 34 that are rigidly connected to one another moves with respect to the component 12. The axes passing through the poles of the four magnets are all parallel. In a plane that is perpendicular to the axes passing through the poles, an orthogonal coordinate system O, x, y may be set up. The four magnets 31, 32, 33 and 34 are all located on one side of the plane and are flush with the plane of the coordinate system. The component 12 moves in proximity to the set 30 on the other side of the plane, following a trajectory along one of the axes of the coordinate system, the axis O, x in the example shown. Conventionally, four quadrants I, II, III and IV are defined in the coordinate system O, x, y by ordering them anticlockwise around the origin O of the coordinate system. The four magnets 31, 32, 33 and 34 are each positioned in one quadrant of the coordinate system. In two consecutive quadrants, the poles of the magnets alternate. More specifically, in quadrant I, the south pole of the magnet 31 is in the plane of the coordinate system, in quadrant II, the north pole of the magnet 32 is in the plane, in quadrant III, the south pole of the magnet 33 is in the plane and in quadrant IV, the north pole of the magnet 34 is in the plane.

FIG. 2b shows, for the configuration of FIG. 2a and in a manner akin to that of FIG. 1b, three curves that are functions of the trajectory of the set 30, which trajectory is shown on the abscissa. A first curve 35 represents the intensity of the magnetic field received by the component 12 along the trajectory of the set 30. When the component 12 is above quadrants II and III, the intensity of the magnetic field received by the component 12 is positive and when the component 12 is above quadrants I and IV, the intensity of the magnetic field received by the component 12 is negative. The curve 35 is symmetrical with respect to the point O at which the component 12 passes from quadrants II and III to quadrants I and IV. Of main interest is the portion of the curve 35 that is located in the vicinity of the centre of symmetry O, which portion is surrounded by a dashed line 37 in FIG. 2b. In this portion, the curve 35 substantially forms a straight line, the slope of which depends on the geometry of the magnets 31 to 34 and on their magnetic properties. In order to better understand the interaction between the set of magnets 30 and the component 12, the slope of the curve 35 in the vicinity of the point O has been decreased.

As above, the opening threshold and the closing threshold of the component 12 are not identical in the two directions of movement of the component 12 with respect to the set 30 along the axis O, x. Two curves 41 and 42 represent, in binary form, the state of the component 12 as a function of the direction of movement of the component 12 along the axis O, x. The curve 41 represents the state of the component 12 when it moves in the x positive direction and the curve 42 when it moves in the reverse direction. Outside the portion surrounded by the dashed line 37, an offset 43 that is akin to the offset 23 described above is seen. Inside the portion surrounded by the dashed line 37, an offset 44 that is smaller than the offset 43 is seen, thereby making it possible to locate the component 12 with respect to the set 30 more accurately than in the configuration described with the aid of FIGS. 1*a* and 1*b*.

The curves 35, 41 and 42 represent the intensity of the magnetic field received by the component 12 along with its binary state for a given temperature of the magnets 31 to 34 and for a trajectory of the component 12 precisely along the axis O, x. However, in practice, the temperature of the magnets 31 to 34 and the variations in the trajectory substantially affect the shape of the curve 35 and in particular the slope of this curve in the portion surrounded by the dashed line 37. A change in the slope leads to a variation in the offset 44 and hence a variation in the accuracy of the position measurement arising from the sensor. Internal tests have shown that if the trajectory of the component 12 reached half of the width of one of the magnets 31 to 34, the sensor became ineffective.

FIG. 3 schematically shows a preferred configuration of a sensor according to the invention. The sensor comprises the component 12 that is sensitive to a variation in magnetic field and a set 50 comprising two pairs of magnets 51 and 52 that are immovable with respect to one another. The component 12 may move with respect to the set 50. The component 12 and the set 50 form a sensor that is intended to determine the relative position of two physical objects with respect to one another. The component is attached to one of the objects and the set 50 is attached to the other of the objects. The component 12 delivers information relating to its position with respect to the set 50.

The pair 51 comprises two magnets 55 and 56, the polar axes of which passing through their respective poles are parallel. Similarly, the pair 52 comprises two magnets 57 and 58, the axes of which passing through their respective poles are parallel. In each of the pairs 51 and 52, the orientation of each of the magnets alternates. For each magnet, the axis passing through the poles is represented by a vertical arrow that is conventionally oriented from the south pole to the north pole of the magnet. For the magnet 55, the north pole is shown pointing down and for the magnet 56 the north pole is shown pointing up. It is of course possible to reverse the orientation of the two magnets 55 and 56. The same applies to the pair 52 in which the orientation of the two magnets also alternates.

In addition, an air gap 60 is formed between the two pairs 51 and 52. The air gap 60 is configured to allow the component 12 to pass therethrough. A width l of the air gap is defined as the distance separating the two pairs and a height h of the air gap is defined in parallel to the axes of the magnets. The trajectory of the component 12 through the air gap 60 is perpendicular to the height and to the width of the air gap 60. The width l and the height h are configured to allow the component to pass through with a tolerance that is sufficient to absorb any mechanical tolerance and any thermal expansion of the system in which the sensor is placed.

On either side of the air gap, each magnet of one pair faces a magnet of the other pair and the magnets facing one another have the same orientation. In the example shown, the magnets 55 and 57 have the same orientation, i.e. their south pole is pointing up and the magnets 56 and 58 have the same orientation, i.e. their north pole is pointing up.

With this arrangement, the intensity of the magnetic field in the air gap is constant across the entire width l of the air gap 60 and over a large portion of its height h. As such, the sensor tolerates deviations in the positioning of the component 12 with respect to the height and the width of the air gap without the magnetic intensity received by the component 12 being modified.

The intensity of the magnetic field in the air gap 60 is mainly dependent on the width of the air gap and on the magnetic characteristics of the magnets. The wider the air gap, the more the intensity decreases. It is therefore advantageous to decrease the width of the air gap 60 as much as possible. Furthermore, reed relays are sensitive to the magnetic field along a single axis denoted by 70 in FIG. 3. In order to ensure optimum operation, the sensor is configured so that the axis 70 of the component 12 is parallel to the axes passing through the poles of the various magnets. It is also possible to make use of a component 12 having multiple sensitive axes. At least one of its sensitive axes is parallel to the axes passing through the poles of the various magnets, often termed magnetization axes.

In FIG. 3, the magnets 55 and 56 of the pair 51 make contact with one another and the magnets 57 and 58 of the pair 52 also make contact with one another. This allows a rapid reversal of the magnetic field in the air gap 60 at the junction of the two magnets of one and the same pair. Alternatively, it is possible to separate the two magnets of one and the same pair. This separation makes it possible to control the variation in the magnetic field along the x-axis.

Figure 4:
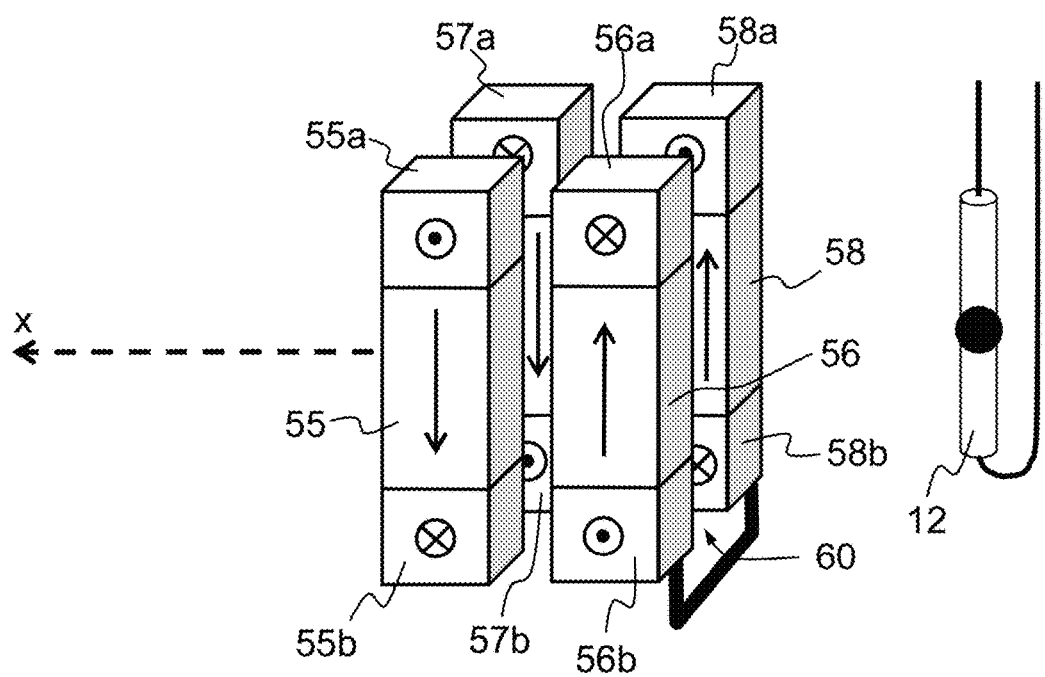
FIG. 4 shows a variant of the configuration of FIG. 3.

FIG. 4 shows a variant of the configuration of FIG. 3 in which additional magnets are added to the pole end of the magnets of the set 50. For a given magnet, it is possible to build it into a Halbach structure which has the advantage of concentrating the magnetic flux along one of the faces of the magnet. Applied to the invention, the orientation of the additional magnets is chosen so as to concentrate the flux in the air gap 60. This configuration tends to concentrate the magnetic flux in the air gap 60.

For a given magnet, the two additional magnets are denoted by the reference of the main magnet followed by the letter a or b. For example, for the magnet 55, an additional magnet 55*a* is positioned on its south pole face. The polar axis of the additional magnet 55*a* is oriented along the width of the air gap 60 with its south pole bordering the air gap 60. The additional magnet 55*b* is positioned on the north pole face of the magnet 55. The polar axis of the additional magnet 55*b* is also oriented along the width of the air gap 60 but with its north pole bordering the air gap 60. The orientation of the additional magnets of the main magnets 56, 57 and 58 is shown in FIG. 4 and is deduced by permutation in order to obtain, for each one, a Halbach structure concentrating the magnetic flux in the air gap 60.

The invention claimed is:

1. A position sensor comprising:
 a first element comprising a component that is sensitive to a magnetic field;

a second element comprising first and second pairs of magnets fixed relative to each other, wherein the orientation of each of the pairs of magnets is based on a reversed poles orientation; and an air gap formed between the pairs of magnets, wherein the component is configured to pass through the air gap perpendicular to a magnetic axis of the first and second pairs of magnets, wherein a first magnet of the first pair of magnets faces a second magnet of the second pair of magnets, the first and second magnets having the same orientation, and a third magnet of the first pair magnets faces a fourth magnet of the second pair of magnets, the third and fourth magnets having the same orientation.

2. The position sensor according to claim 1, in which poles of each of the magnets are positioned on axes that are parallel to one another, in which the two elements are intended to move along an axis that is perpendicular to the axes of the poles of the magnets.

3. The position sensor according to claim 2, in which the component has an axis that is sensitive to the magnetic field and in which the sensor is configured so that a sensitive axis of the component is perpendicular to the axis of movement of the two elements.

4. The position sensor according to claim 3, in which, for the two pairs of magnets, the magnets of one and the same pair make contact with one another.

5. The position sensor according to claim 3, in which, for the two pairs of magnets, the magnets of one and the same pair are spaced a distance from one another.

6. The position sensor according to claim 2, in which, for the two pairs of magnets, the magnets of one and the same pair make contact with one another.

7. The position sensor according to claim 2, in which, for the two pairs of magnets, the magnets of one and the same pair are spaced a distance from one another.

8. The position sensor according to claim 1, in which, for the two pairs of magnets, the magnets of one and the same pair make contact with one another.

9. The position sensor according to claim 1, in which, for the two pairs of magnets, the magnets of one and the same pair are spaced a distance from one another.

10. The position sensor according to claim 1, further comprising additional magnets positioned at a pole end of each of the magnets of the two pairs in a Halbach configuration in order to concentrate the magnetic flux inside the air gap.

11. The position sensor according to claim 1, in which the component is a switch that is sensitive to the magnetic field.

12. The position sensor according to claim 1, in which the component makes use of the Hall effect in order to detect a variation in magnetic field.

* * * * *